United States Patent
McClure et al.

(10) Patent No.: US 7,688,669 B2
(45) Date of Patent: Mar. 30, 2010

(54) PROGRAMMABLE SRAM SOURCE BIAS SCHEME FOR USE WITH SWITCHABLE SRAM POWER SUPPLY SETS OF VOLTAGES

(75) Inventors: David C. McClure, Carrollton, TX (US); Mark A. Lysinger, Carrollton, TX (US); Mehdi Zamanian, Carrollton, TX (US); François Jacquet, Froges (FR); Philippe Roche, Le Versoud (FR)

(73) Assignees: STMicroelectronics, Inc., Carrollton, TX (US); STMicroelectronics SA (FR)

( * ) Notice: Subject to any disclaimer, the term of this patent is extended or adjusted under 35 U.S.C. 154(b) by 221 days.

(21) Appl. No.: 12/029,366

(22) Filed: Feb. 11, 2008

(65) Prior Publication Data
US 2008/0198678 A1    Aug. 21, 2008

Related U.S. Application Data

(60) Provisional application No. 60/901,370, filed on Feb. 15, 2007.

(51) Int. Cl.
*G11C 7/00* (2006.01)
(52) U.S. Cl. .................. 365/226; 365/189.09; 365/229
(58) Field of Classification Search ................ 365/226, 365/189.09, 229, 207
See application file for complete search history.

(56) References Cited

U.S. PATENT DOCUMENTS 5,555,215 A * 9/1996 Nakagome et al. .......... 365/226
5,570,313 A    10/1996 Masson et al.
5,726,562 A    3/1998  Mizuno et al.
6,838,926 B2  1/2005  Jung et al.
6,891,745 B2  5/2005  Liaw
6,999,338 B1  2/2006  Hirabayashi
7,112,895 B2  9/2006  Hokenmaier
7,254,085 B2  8/2007  Hirabayashi
7,307,907 B2  12/2007  Houston (Continued)

OTHER PUBLICATIONS

Kouichi Kumagai, A Novel Powering-down Scheme for Low Vt CMOS Circuits, IEEE, Symposium on VLSI Circuits Digest of Technical Papers, 1998, pp. 44-45.

(Continued)

*Primary Examiner*—David Lam
(74) *Attorney, Agent, or Firm*—Lisa K. Jorgenson; Andre M. Szuwalski (57) ABSTRACT

A memory circuit has a high voltage and low voltage supply nodes. One of a first and second sets of voltages is selectively applied to the supply nodes of the memory circuit in dependence upon memory operational mode. If in active read/write mode, then the first set of voltages is selectively applied. Conversely, if in standby no-read/no-write mode, then the second set of voltages is selectively applied. A low voltage in the second set of voltages is greater than a low voltage in the first set of voltages by a selected one of a plurality of low offset voltages, and a high voltage in the second set of voltages is less than a high voltage in the first set of voltages by a selected one of a plurality of high offset voltages. The offset voltages are provided by diode-based circuits that are selectively active. Selective activation is provided by either selectably blowable fuse elements or selectively activated switching elements.

25 Claims, 7 Drawing Sheets

U.S. PATENT DOCUMENTS

| | | |
|---|---|---|
| 7,372,746 B2 | 5/2008 | Kim |
| 7,382,674 B2 | 6/2008 | Hirabayashi |
| 2001/0038552 A1 | 11/2001 | Ishimaru |
| 2003/0076705 A1 | 4/2003 | Yamaoka et al. |
| 2004/0125681 A1 | 7/2004 | Yamaoka et al. |
| 2005/0117379 A1 | 6/2005 | Kang |
| 2005/0146948 A1 | 7/2005 | Hose et al. |
| 2008/0198678 A1 | 8/2008 | McClure et al. |
| 2008/0211513 A1 | 9/2008 | Lysinger et al. |

OTHER PUBLICATIONS

Extended European Search Report, EP 08 15 1479.6, dated May 26, 2008.

* cited by examiner

PROGRAMMABLE SRAM SOURCE BIAS SCHEME FOR USE WITH SWITCHABLE SRAM POWER SUPPLY SETS OF VOLTAGES

PRIORITY CLAIM

The present application claims the benefit of U.S. Provisional Application for Patent Ser. No. 60/901,370 filed Feb. 15, 2007, the disclosure of which is hereby incorporated by reference.

BACKGROUND OF THE INVENTION

1. Technical Field of the Invention

The present invention relates to power supplies for integrated circuit memories and, more particularly, to a programmable source bias scheme for supplying an offset power supply set of voltages for use in an SRAM standby mode operation.

2. Description of Related Art

Figure 1:
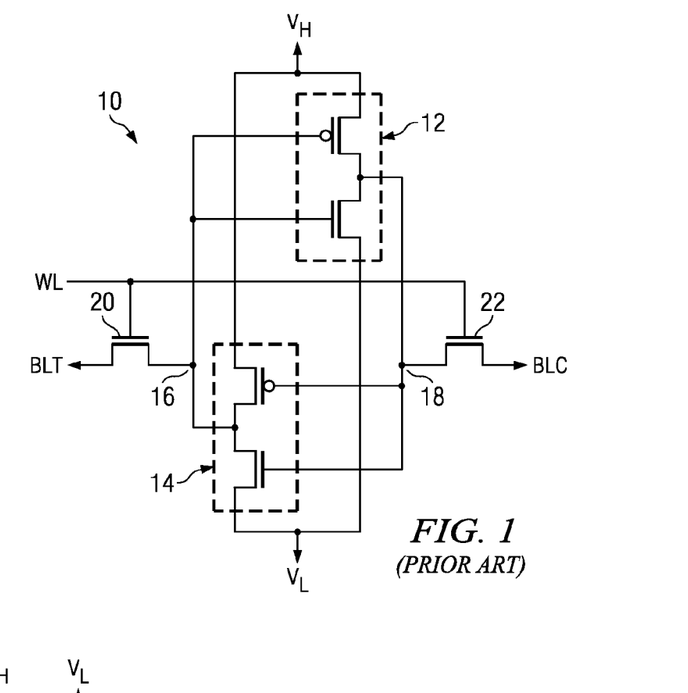
FIG. 1 is a schematic diagram of a standard six transistor static random access memory (SRAM) cell.

Reference is made to FIG. 1 which is a schematic diagram of a standard six transistor static random access memory (SRAM) cell 10. The cell 10 includes two cross-coupled CMOS inverters 12 and 14, each inverter including a series connected p-channel and n-channel transistor pair. The inputs and outputs of the inverters 12 and 14 are coupled to form a latch circuit having a true node 16 and a complement node 18. The cell 10 further includes two transfer (pass gate) transistors 20 and 22 whose gate terminals are controlled by a word line (WL). Transistor 20 is connected between the true node 16 and a true bit line (BLT). Transistor 22 is connected between the complement node 18 and a complement bit line (BLC). The source terminals of the p-channel transistors in each inverter 12 and 14 are coupled to receive a high voltage $V_H$ at a high voltage $V_H$ node, while the source terminals of the n-channel transistors in each inverter 12 and 14 are coupled to receive a low voltage $V_L$ at a low voltage $V_L$ node. The high voltage $V_H$ and the low voltage $V_L$ comprise a power supply set of voltages for the cell 10. Conventionally, the high voltage $V_H$ is a positive voltage (for example, 1.5V) and the low voltage $V_L$ is a ground voltage (for example, 0V). In an integrated circuit including the SRAM cell 10, this power supply set of voltages may be received at pins of the integrated circuit, or may instead be generated on chip by a voltage converter circuit which receives some other set of voltages received from the pins of the chip. The power supply set of voltages $V_H$ and $V_L$ are conventionally applied to the SRAM cell 10 at all times that the cell/integrated circuit is operational.

Figure 2:
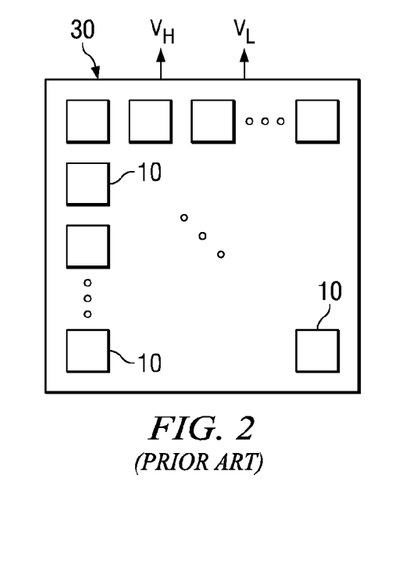
FIG. 2 shows a block diagram of a static random access memory (SRAM) array.

Reference is now made to FIG. 2 which is a block diagram of a static random access memory (SRAM) array 30. The array 30 includes a plurality of SRAM cells 10 arranged in a matrix format. The number of cells 10 included in the array 30 can widely vary depending on the circuit designer's needs. The high voltage $V_H$ and the low voltage $V_L$ of the power supply set of voltages is applied to the array 30 and distributed over the array in a manner well known to those skilled in the art to the individual ones of the included cells 10 (for application to the source terminals of the p-channel and n-channel transistors as shown in FIG. 1).

Figure 3:
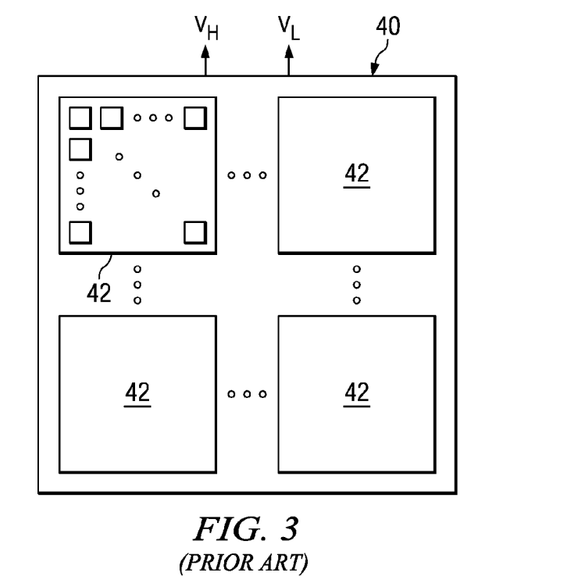
FIG. 3 shows a block diagram of a static random access memory (SRAM) array.

Reference is now made to FIG. 3 which is a block diagram of a static random access memory (SRAM) array 40. The array 40 is comprised of a plurality of memory blocks 42 arranged in a matrix format. The number of blocks 42 included in the array 40 can widely vary depending on the circuit designer's needs. Each block 42 includes a plurality of SRAM cells 10 also arranged in a matrix format. The number of cells 10 included in the block 42 can widely vary depending on the circuit designer's needs. The high voltage $V_H$ and the low voltage $V_L$ Of the power supply set of voltages is applied to the array 40 and distributed over the array by a power distribution grid in a manner well known to those skilled in the art to each of the blocks 42. Power is then passed on to the individual ones of the included cells 10 within each block 42 (for application to the source terminals of the p-channel and n-channel transistors as shown in FIG. 1).

SUMMARY

In an embodiment, a circuit comprises: a memory circuit receiving a high supply voltage and a low supply voltage; and a programmable bias circuit which generates, from a first set of voltages, a second set of voltages for application as the high supply voltage and a low supply voltage. The programmable bias circuit comprises: a high side circuit and a low side circuit. The high side circuit includes a first plurality of individually selectable voltage offset circuits each of which providing a different offset voltage between a high voltage of the first set of voltages and a high voltage of the second set of voltages, wherein the high voltage of the second set of voltages is less than the high voltage of the first set of voltages. The low side circuit includes a second plurality of individually selectable voltage offset circuits each of which providing a different offset voltage between a low voltage of the first set of voltages and a low voltage of the second set of voltages, wherein the low voltage of the second set of voltages is greater than the low voltage of the first set of voltages.

In another embodiment, a circuit comprises: a memory circuit having a high voltage supply node and a low voltage supply node; first circuitry receiving a first high supply voltage and a second high supply voltage and operating responsive to a first control signal to apply the first high supply voltage to the high voltage supply node if the first control signal has a first state, and apply the second high supply voltage to the high voltage supply node if the first control signal has a second state; a high side supply circuit that generates the second high supply voltage which is less than the first high supply voltage by a selectable one of a plurality of high side voltage offsets; second circuitry receiving a first low supply voltage and a second low supply voltage and operating responsive to a second control signal to apply the first low supply voltage to the low voltage supply node if the second control signal has a first state, and apply the second low supply voltage to the low voltage supply node if the second control signal has a second state; and a low side supply circuit that generates the second low supply voltage which is greater than the first low supply voltage by a selectable one of a plurality of low side voltage offsets.

In another embodiment, a circuit comprises: a memory circuit having a high voltage supply node and a low voltage supply node; circuitry to selectively apply one of a first set of voltages and a second set of voltages to the high and low voltage supply nodes of the memory circuit in dependence upon an operational mode of the memory circuit, wherein the circuitry selectively applies the first set of voltages if the memory circuit is in active read or write mode and selectively applies the second set of voltages if the memory circuit is in standby no-read or no-write mode; and a voltage generating circuit that generates the second set of voltages to have a low voltage higher than a low voltage in the first set of voltages by a selected one of a plurality of low offset voltages, and have a high voltage less than a high voltage in the first set of voltages by a selected one of a plurality of high offset voltages.

BRIEF DESCRIPTION OF THE DRAWINGS

Other objectives, features and advantages of the invention will become apparent upon reading the following description, presented solely by way of non-limiting example and with reference to the appended drawings, in which.

DETAILED DESCRIPTION OF THE DRAWINGS

Figure 4:
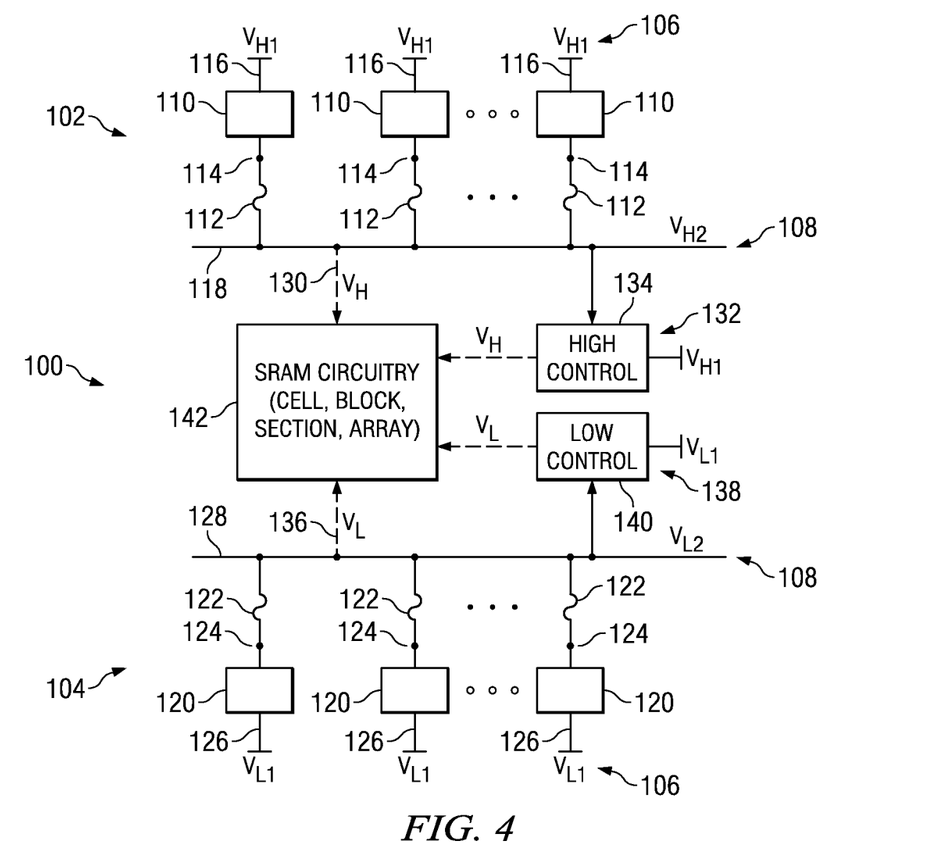
FIG. 4 is a block diagram of an embodiment for a programmable SRAM source bias circuit.

Reference is now made to FIG. 4 wherein there is shown a block diagram of an embodiment for a programmable SRAM source bias circuit 100 to generate a given power supply set of voltages for application as the high voltage $V_H$ and low voltage $V_L$ for SRAM circuitry 142 (such as that circuitry shown in FIGS. 1-3 and other circuitry discussed herein). The circuit 100 includes a high side source bias circuit 102 associated with generating the high voltage $V_H$ and a low side source bias circuit 104 associated with generating the low voltage $V_L$. The circuit 100 is powered, for example, by a first power supply set of voltages 106 which include a high voltage $V_{H1}$ (of, for example, 1.2V-1.5V) and a low voltage $V_{L1}$ (of, for example, 0V ground), but could alternatively receive some other set of voltages if desired. This circuit 100 generates a second power supply set of voltages 108 which include a high voltage $V_{H2}$ which is selectively and programmably offset to be less than the high voltage $V_{H1}$ and generates a low voltage $V_{L2}$ which is selectively and programmably offset to be greater than the low voltage $V_{L1}$. The values of the voltage offsets are selected in a manner described in detail below and are applicable even if the circuit is powered from some other set of voltages than the first power supply set of voltages 106.

The high side source bias circuit 102 comprises a set of diode circuits 110 (for example, of the p-channel MOS transistor type). Each diode circuit 110 is connected in series with an associated fuse element 112 at node 114. The series connected diode circuit 110 and fuse element 112 are coupled between the high voltage $V_{H1}$ of the first set of voltages 106 (at node 116) and an SRAM high power supply line 118 which may form part of a power supply grid associated with SRAM circuitry 142 (such as the SRAM circuits shown in FIGS. 1-3 and other circuitry discussed herein). Each diode circuit 110 is circuit designed to exhibit a different voltage drop across terminals 114 and 116. Through a selective blowing of the fuse elements 112 (using overcurrent, laser blasting, or other operations known to those skilled in the art), a selectable and programmable voltage offset can be forced between the high voltage $V_{H1}$ of the first set of voltages 106 and the high voltage $V_{H2}$ of the second power supply set of voltages 108 at the SRAM high power supply line 118.

In one implementation, shown at reference 130, the offset high voltage $V_{H2}$ of the second power supply set of voltages 108 is applied from the SRAM high power supply line 118 as the high voltage $V_H$ supply of the SRAM circuitry 142 (for example, by connection to the sources of the p-channel transistors in the SRAM cell). In another implementation, shown at reference 132, the offset high voltage $V_{H2}$ of the second power supply set of voltages 108 is applied from the SRAM high power supply line 118 to a high control circuit 134 which functions to selectively apply either the offset high voltage $V_{H2}$ or the high voltage $V_{H1}$ of the first set of voltages 106 as the high voltage $V_H$ supply of the SRAM circuitry 142 (for example, by connection to the sources of the p-channel transistors in the SRAM cell).

It will be understood that in the high side source bias circuit 102 after selection and programming preferably only one fuse element 112 remains intact at packaging of the integrated circuit. All other fuse elements 102 are blown in order to complete programming of the offset voltage selection. This accordingly sets the offset between the high voltage $V_{H1}$ of the first set of voltages 106 and the high voltage $V_{H2}$ of the second power supply set of voltages 108 to be equal to the designed voltage drop of the only remaining diode circuit 110 whose fuse element 112 was not blown. The choice as to which fuse element 112 is not to be blown is made in accordance with a programming, setting or trimming voltage selection functionality or operation with respect to an integrated circuit which includes the SRAM source bias circuit 100 and the SRAM circuitry 142. Notwithstanding the foregoing, if desired plural fuse elements 112 can remain intact at packaging to provide a voltage offset through parallel circuits different than is obtainable with one diode circuit 110 alone.

The low side source bias circuit 104 comprises a set of diode circuits 120 (for example, of the n-channel MOS transistor type). Each diode circuit 120 is connected in series with an associated fuse element 122 at node 124. The series connected diode circuit 120 and fuse element 122 are coupled between the low voltage $V_{L1}$ of the first set of voltages 106 (at node 126) and an SRAM low power supply line 128 which may form part of a power supply grid associated with SRAM circuitry 142 (such as the SRAM circuits shown in FIGS. 1-3 and other circuitry discussed herein). Each diode circuit 120 is circuit designed to exhibit a different voltage drop across terminals 124 and 126. Through a selective blowing of the fuse elements 122 (using overcurrent, laser blasting, or other operations known to those skilled in the art), a selectable and programmable voltage offset can be forced between the low voltage $V_{L1}$ of the first set of voltages 106 and the low voltage $V_{L2}$ of the second power supply set of voltages 108 at the SRAM low power supply line 128.

In one implementation, shown at reference 136, the offset low voltage $V_{L2}$ of the second power supply set of voltages 108 is applied from the SRAM low power supply line 128 as the low voltage $V_L$ supply of the SRAM circuitry 142 (for example, for connection to the sources of the n-channel transistors in the SRAM cell). In another implementation, shown at reference 138, the offset low voltage $V_{L2}$ of the second power supply set of voltages 108 is applied from the SRAM low power supply line 128 to a low control circuit 140 which functions to selectively apply either the offset low voltage $V_{L2}$ or the low voltage $V_{L1}$ of the first set of voltages 106 as the low voltage $V_L$ supply of the SRAM circuitry 142 (for example, for connection to the sources of the n-channel transistors in the SRAM cell).

It will be understood that in the low side source bias circuit 104 after selection and programming preferably only one fuse element 122 remains intact at packaging of the integrated circuit. All other fuse elements are blown in order to complete programming of the offset voltage selection. This accordingly sets the offset between the low voltage $V_{L1}$ of the first set of voltages 106 and the low voltage $V_{L2}$ of the second power supply set of voltages 108 to be equal to the designed voltage drop of the only remaining diode circuit 120 whose fuse element 122 was not blown. The choice as to which fuse element 122 is not to be blown is made in accordance with a programming, setting or trimming voltage selection functionality or operation with respect to an integrated circuit which includes the SRAM source bias circuit 100 and the SRAM circuitry 142. Notwithstanding the foregoing, if desired plural fuse elements 122 can remain intact at packaging to provide a voltage offset through parallel circuits different than is obtainable with one diode circuit 120 alone.

Figure 5A:
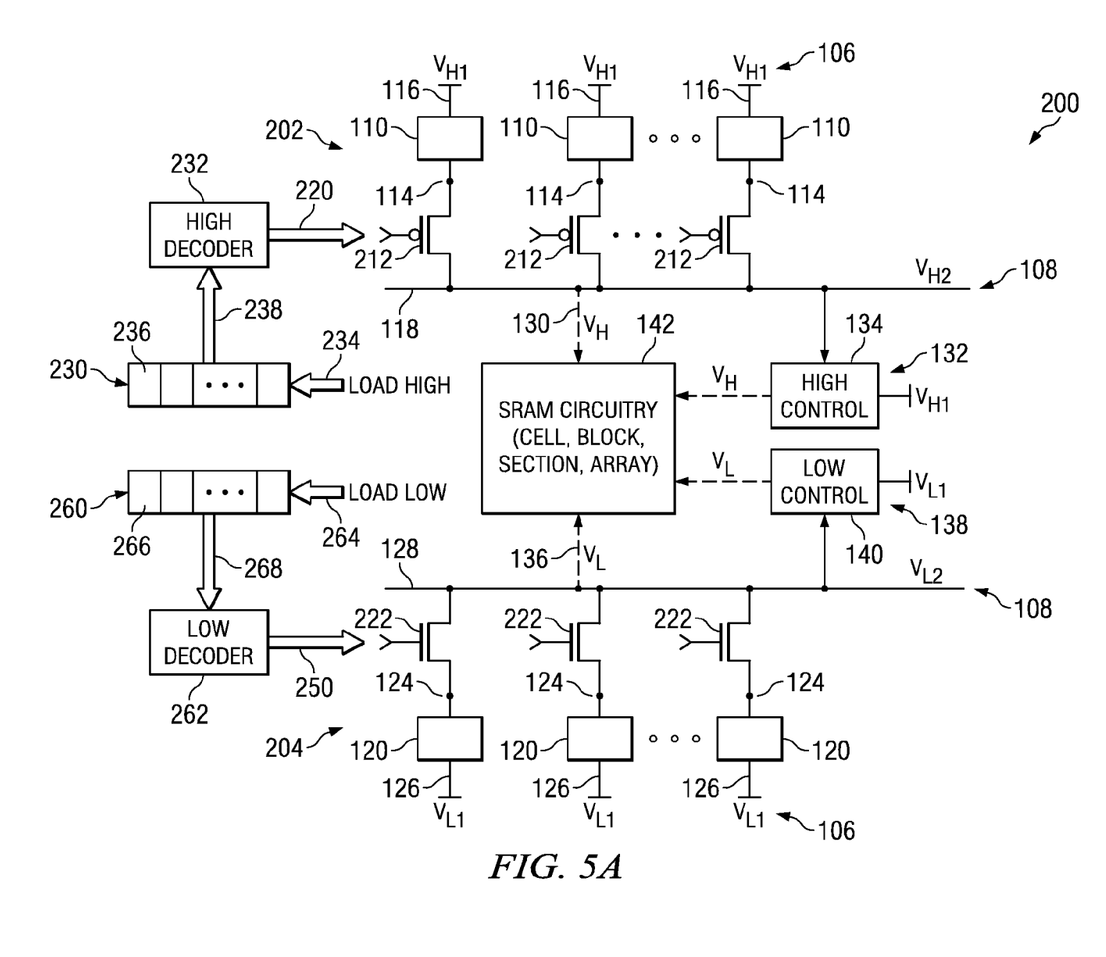
FIG. 5A is a block diagram of another embodiment for a programmable SRAM source bias circuit.

Reference is now made to FIG. 5A wherein there is shown a block diagram of an embodiment for a programmable SRAM source bias circuit 200 to generate a given power supply set of voltages for application as the high voltage $V_H$ and low voltage $V_L$ for SRAM circuitry 142 (such as that circuitry shown in FIGS. 1-3 and other circuitry discussed herein). The circuit 200 includes a high side source bias circuit 202 associated with generating the high voltage $V_H$ and a low side source bias circuit 204 associated with generating the low voltage $V_L$. The circuit 200 is powered by a first power supply set of voltages 106 which include a high voltage $V_{H1}$ (of, for example, 1.2V-1.5V) and a low voltage $V_{L1}$ (of, for example, 0V ground), but could alternatively receive some other set of voltages if desired. This circuit 200 generates a second power supply set of voltages 108 which include a high voltage $V_{H2}$ which is selectively and programmably offset to be less than the high voltage $V_{H1}$ and generates a low voltage $V_{L2}$ which is selectively and programmably offset to be greater than the low voltage $V_{L1}$. The values of the voltage offsets are selected in a manner described in detail below and are applicable even if the circuit is powered from some other set of voltages than the first power supply set of voltages 106.

The high side source bias circuit 202 comprises a set of diode circuits 110 (for example, of the p-channel MOS transistor type). Each diode circuit 110 is connected in series with an associated control element 212 (p-channel MOS) at node 114. The series connected diode circuit 110 and control element 212 are coupled between the high voltage $V_{H1}$ of the first set of voltages 106 (at node 116) and an SRAM high power supply line 118 which may form part of a power supply grid associated with SRAM circuitry 142 (such as that shown in FIGS. 1-3 and other circuitry discussed herein). Each diode circuit 110 is circuit designed to exhibit a different voltage drop across terminals 114 and 116. Through a selective actuation of the control elements 212 (using control signals 220 applied to the gate terminals of p-channel MOS transistors as known to those skilled in the art), a selectable and programmable voltage offset can be forced between the high voltage $V_{H1}$ of the first set of voltages 106 and the high voltage $V_{H2}$ of the second power supply set of voltages 108 at the SRAM high power supply line 118.

In one implementation, shown at reference 130, the offset high voltage $V_{H2}$ of the second power supply set of voltages 108 is applied from the SRAM high power supply line 118 as the high voltage $V_H$ supply of the SRAM circuitry 142 (for example, for connection to the sources of the p-channel transistors in the SRAM cell). In another implementation, shown at reference 132, the offset high voltage $V_{H2}$ of the second power supply set of voltages 108 is applied from the SRAM high power supply line 118 to a high control circuit 134 which functions to selectively apply either the offset high voltage $V_{H2}$ or the high voltage $V_{H1}$ of the first set of voltages 106 as the high voltage $V_H$ supply of the SRAM circuitry 142 (for example, for connection to the sources of the p-channel transistors in the SRAM cell).

It will be understood that in the high side source bias circuit 202 after selection and programming preferably only one of the plural control elements 212 is selected for actuation in order to make the offset voltage selection. In other words, only one of the control signals 220 applied to the gate terminals of the MOS transistors is logic low (all others are logic high). This accordingly sets the offset between the high voltage $V_{H1}$ of the first set of voltages 106 and the high voltage $V_{H2}$ of the second power supply set of voltages 108 to be equal to the designed voltage drop of the only remaining diode circuit 110 whose control element 212 is actuated (with a logic low control signal 220).

The choice as to which control element 212 is to be actuated is made in accordance with a programming, setting or trimming voltage selection functionality or operation with respect to an integrated circuit which includes the SRAM source bias circuit 200 and the SRAM circuitry 142. This programming, setting or trimming voltage selection operation is implemented using a high register 230 and high decoder circuit 232. The high register 230 is a multi-bit register which can be loaded 234 (either serially or in parallel) with high side voltage offset selection data. Each bit in the register 230 is formed of a latch circuit 236. The outputs 238 of the latch circuits 236 of the register 230, which are representative of loaded 234 programming, setting or trimming high side voltage offset selection data, are applied to the inputs of the high decoder circuit 232. The high decoder circuit 232 functions to decode the received selection data and output the control signals 220 for application to the control elements 212 in the high side source bias circuit 202. As discussed above, only one of those control signals 220 will be active (i.e., logic low), and thus only one control element 212 will be turned on. The designed voltage drop associated with the diode circuit 110 whose control element 212 is actuated will constitute the selectable and programmable voltage offset that is forced between the high voltage $V_{H1}$ of the first set of voltages 106 and the high voltage $V_{H2}$ of the second power supply set of voltages 108 at the SRAM high power supply line 118.

The low side source bias circuit 204 comprises a set of diode circuits 120 (for example, of the n-channel MOS transistor type). Each diode circuit 120 is connected in series with an associated control element 222 (n-channel MOS) at node 124. The series connected diode circuit 120 and control element 222 are coupled between the low voltage $V_{L1}$ of the first set of voltages 106 (at node 126) and an SRAM low power supply line 128 which may form part of a power supply grid associated with SRAM circuitry 142 (such as that shown in FIGS. 1-3 and other circuitry discussed herein). Each diode circuit 120 is circuit designed to exhibit a different voltage drop across terminals 124 and 126. Through a selective actuation of the control elements 222 (using control signals 250 applied to the gate terminals of the n-channel MOS transistors as known to those skilled in the art), a selectable and programmable voltage offset can be forced between the low voltage $V_{L1}$ of the first set of voltages 106 and the low voltage $V_{L2}$ of the second power supply set of voltages 108 at the SRAM low power supply line 128.

In one implementation, shown at reference 136, the offset low voltage $V_{L2}$ of the second power supply set of voltages 108 is applied from the SRAM low power supply line 128 as the low voltage $V_L$ supply of the SRAM circuitry 142 (for example, for connection to the sources of the n-channel transistors in the SRAM cell). In another implementation, shown at reference 138, the offset low voltage $V_{L2}$ of the second power supply set of voltages 108 is applied from the SRAM low power supply line 128 to a low control circuit 140 which functions to selectively apply either the offset low voltage $V_{L2}$ or the low voltage $V_{L1}$ of the first set of voltages 106 as the low voltage $V_L$ supply of the SRAM circuitry 142 (for example, for connection to the sources of the n-channel transistors in the SRAM cell).

It will be understood that in the low side source bias circuit 204 after selection and programming preferably only one of the plural control elements 222 is selected for actuation in order to make the offset voltage selection. In other words, only one of the control signals 250 applied to the gate terminals of the MOS transistors is logic high (all others are logic low). This accordingly sets the offset between the low voltage $V_{L1}$ of the first set of voltages 106 and the low voltage $V_{L2}$ of the second power supply set of voltages 108 to be equal to the designed voltage drop of the only remaining diode circuit 120 whose control element 222 is actuated (with a logic high control signal 250).

The choice as to which control element 222 is to be actuated is made in accordance with a programming, setting or trimming voltage selection functionality or operation with respect to an integrated circuit which includes the SRAM source bias circuit 200 and the SRAM circuitry 142. This programming, setting or trimming voltage selection operation is implemented using a low register 260 and low decoder circuit 262. The low register 260 is a multi-bit register which can be loaded 264 (either serially or in parallel) with low side voltage offset selection data. Each bit in the register 260 is formed of a latch circuit 266. The outputs 268 of the latch circuits 266 of the register 260, which are representative of loaded 264 programming, setting or trimming low side voltage offset selection data, are applied to the inputs of the low decoder circuit 262. The low decoder circuit 262 functions to decode the received selection data and output the control signals 250 for application to the control elements 222 in the low side source bias circuit 204. As discussed above, only one of those control signals 250 will be active (i.e., logic high), and thus only one control element 222 will turned on. The designed voltage drop associated with the diode circuit 120 whose control element 222 is actuated will constitute the selectable and programmable voltage offset that is forced between the low voltage $V_{L1}$ of the first set of voltages 106 and the low voltage $V_{L2}$ of the second power supply set of voltages 108 at the SRAM low power supply line 128.

Through appropriate design of the decoder circuits 232 and 262, a configuration can be provided wherein given data 238 and 268 loaded into registers 230 and 260 can result in the simultaneous actuation of two or more control elements 212 and/or two or more control elements 222. This would connect, for example, two diode circuits 110 in parallel to provide an offset voltage on the high side different than could be obtained from one diode circuit 110 alone. Likewise, this would connect, for example, two diode circuits 120 in parallel to provide an offset voltage on the low side different than could be obtained from one diode circuit 120 alone.

Figure 5B:
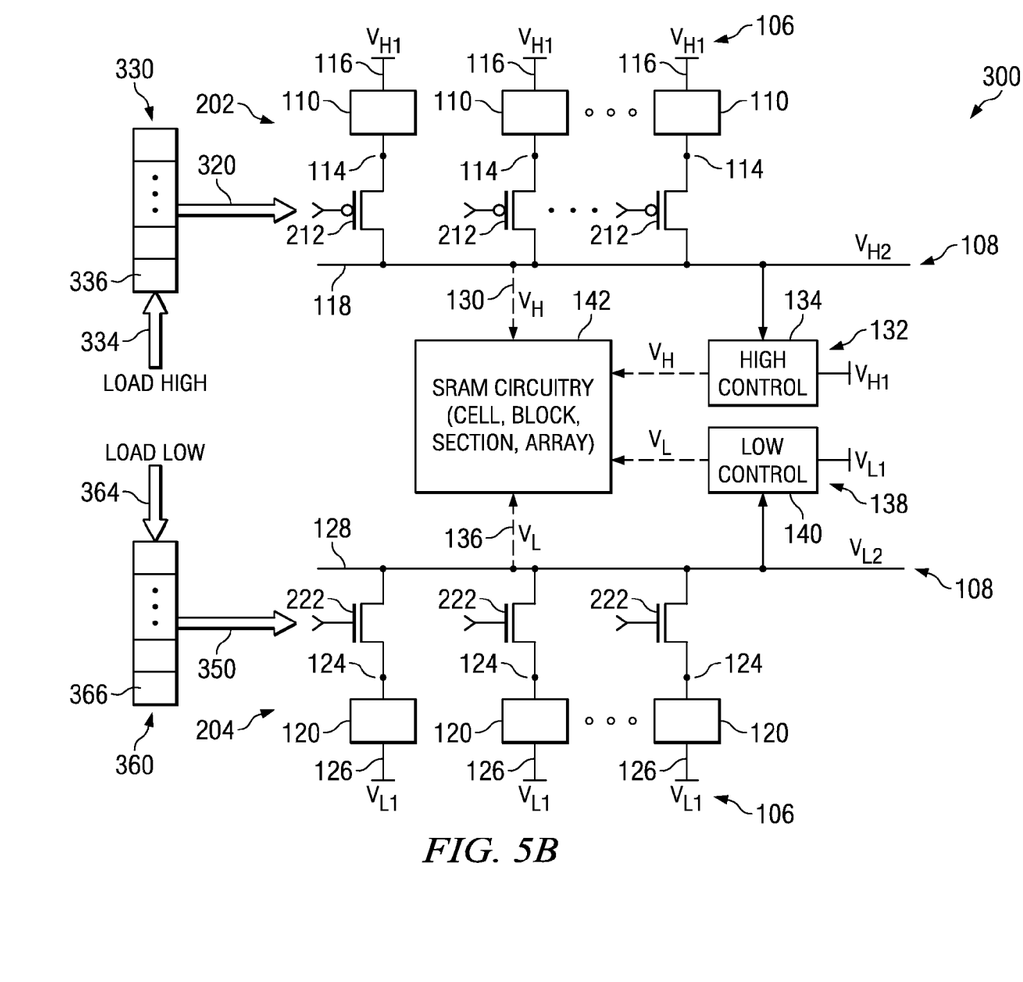
FIG. 5B is a block diagram of another embodiment for a programmable SRAM source bias circuit.

Reference is now made to FIG. 5B wherein there is shown a block diagram of an embodiment for a programmable SRAM source bias circuit 300 to generate a given power supply set of voltages for application as the high voltage $V_H$ and low voltage $V_L$ for SRAM circuitry 142 (such as that circuitry shown in FIGS. 1-3 and other circuitry discussed herein). The circuit 300 includes a high side source bias circuit 202 associated with generating the high voltage $V_H$ and a low side source bias circuit 204 associated with generating the low voltage $V_L$. The circuit 300 is powered by a first power supply set of voltages 106 which include a high voltage $V_{H1}$ (of, for example, 1.2V-1.5V) and a low voltage $V_{L1}$ (of, for example, 0V ground), but could alternatively receive some other set of voltages if desired. This circuit 300 generates a second power supply set of voltages 108 which include a high voltage $V_{H2}$ which is selectively and programmably offset to be less than the high voltage $V_{H1}$ and generates a low voltage $V_{L2}$ which is selectively and programmably offset to be greater than the low voltage $V_{L1}$. The values of the voltage offsets are selected in a manner described in detail below and are applicable even if the circuit is powered from some other set of voltages than the first power supply set of voltages 106.

The high side source bias circuit 202 and low side source bias circuit 204 have a configuration like that shown in FIG. 5A thus will not be discussed further. Like reference numbers in FIG. 5B refer to like parts in FIG. 5A.

The choice as to which control element 212 is to be actuated is made in accordance with a programming, setting or trimming voltage selection functionality or operation with respect to an integrated circuit which includes the SRAM source bias circuit 300 and the SRAM circuitry 142. This programming, setting or trimming voltage selection operation is implemented using a high register 330. The high register 330 is a multi-bit register which can be loaded 334 (either serially or in parallel) with high side voltage offset selection data. Each bit in the register 330 is formed of a latch circuit 336. The outputs 320 of the latch circuits 336 of the register 330, which are representative of loaded 334 programming, setting or trimming high side voltage offset selection data, are applied as the gate control signals for application to the control elements 212 in the high side source bias circuit 202.

The choice as to which control element 222 is to be actuated is made in accordance with a programming, setting or trimming voltage selection functionality or operation with respect to an integrated circuit which includes the SRAM source bias circuit 300 and the SRAM circuitry 142. This programming, setting or trimming voltage selection operation is implemented using a low register 360. The low register 360 is a multi-bit register which can be loaded 364 (either serially or in parallel) with low side voltage offset selection data. Each bit in the register 360 is formed of a latch circuit 366. The outputs 350 of the latch circuits 366 of the register 360, which are representative of loaded 364 programming, setting or trimming low side voltage offset selection data, are applied as the gate control signals for application to the control elements 222 in the low side source bias circuit 204.

Generally speaking, only one signal in each of the control signals 320 or 350 will be active at any one time (i.e., there is only one active bit in each of the loaded 334 and 364 selection data), and thus only one corresponding control element 212 or 222 will be turned on. The designed voltage drop associated with the diode circuits 110 and 120 whose control elements 212 and 222 are actuated will constitute the selectable and programmable voltage offset. In particular, the selected diode circuit 110 produces a voltage offset that is forced between the high voltage $V_{H1}$ of the first set of voltages 106 and the high voltage $V_{H2}$ of the second power supply set of voltages 108 at the SRAM high power supply line 118. Likewise, the selected diode circuit 120 produces a voltage offset that is forced between the low voltage $V_{L1}$ of the first set of voltages 106 and the low voltage $V_{L2}$ of the second power supply set of voltages 108 at the SRAM low power supply line 128.

The FIG. 5B implementation also supports a functionality for parallel actuation of plural control elements 212 or 222. This is accomplished through the loading 334 and 364 of plural active bits in each register 330 and 360 (i.e., there are plural one active bits in each of the loaded 334 and 364 selection data). The control elements 212 or 222 associated with each active bit in the registers 330 and 360 will be turned on, and the corresponding diode circuits 110 and 120 will be connected in parallel with each other. This will produce voltage offsets different than those which could be achieved using single ones of the diode circuits 110 and 120 alone.

As discussed above, each of the diode circuits 110 and 120 included in the high side source bias circuit 102/202 and low side source bias circuit 104/204, respectively, has a designed voltage drop. This designed voltage drop can be effectuated in a number of ways.

Figure 6A:
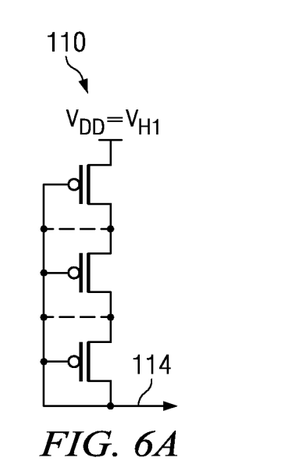
FIGS. 6A-6C illustrate examples of p-channel MOS transistor diode configurations for use as individual voltage offset circuits.
Figure 6B:
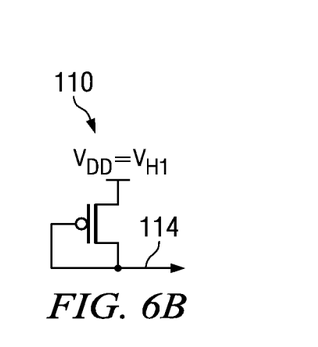
Figure 6C:
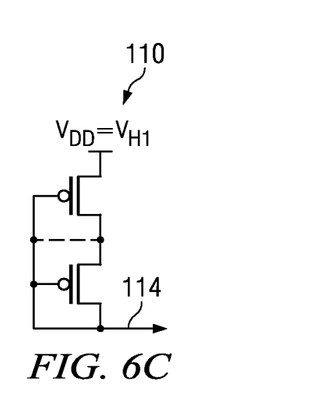

FIGS. 6A-6C illustrate examples of p-channel MOS transistor diode configurations for use as individual ones of the diode circuits 110. FIG. 6A illustrates a diode configuration for use as one or more of the diode circuits 110 comprising three p-channel MOS transistors connected in series with the gates of the three transistors tied together and to a lower most transistor drain (at node 114). FIG. 6B illustrates an exemplary p-channel MOS transistor diode configuration for use as one or more of the diode circuits 110 comprising a single p-channel transistor with its gate tied to its drain (at node 114). FIG. 6C illustrates a diode configuration for use as one or more of the diode circuits 110 comprising two p-channel MOS transistors connected in series with the gates of the two transistors tied together and to a lower most transistor drain (at node 114). The included p-channel transistors in the circuits 110 are sized with W/L ratios selected to provide a certain voltage drop (offset) between the voltage reference and node 114 it being recognized by those skilled in the art that weaker the transistor the larger the voltage drop. A number of circuits 110 are provided, each with a different voltage drop (offset), in order to give a range of possible selections for the applied voltage offset and the high voltage $V_{H2}$. Thus, variations may be made from circuit 110 to circuit 110 of the width and length dimensions for the included p-channel MOS transistors. The correlation between voltage drop and the W/L ratio (size) of the p-channel transistors is well known to those skilled in the art. It will be noted that in the series connected transistor implementations the gates need not be tied together and to the lower most transistor drain, but may alternatively be individually tied to their own drains (as illustrated by the dotted lines in the figures).

Figure 7A:
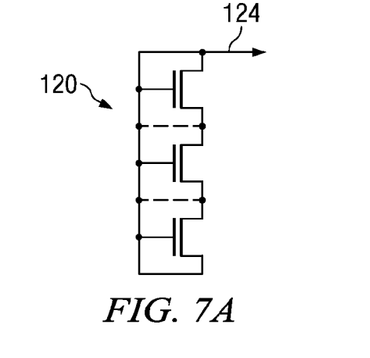
FIGS. 7A-7C illustrate examples of n-channel MOS transistor diode configurations for use as individual voltage offset circuits.
Figure 7B:
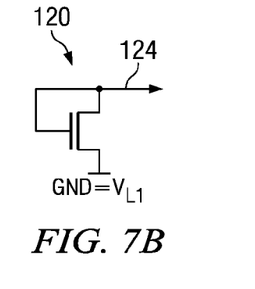
Figure 7C:
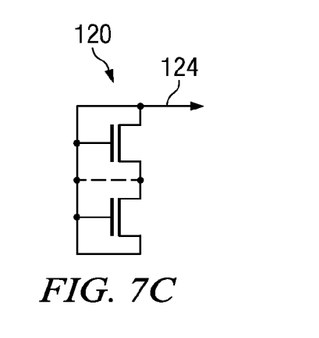

FIGS. 7A-7C illustrate examples of n-channel MOS transistor diode configurations for use as individual ones of the diode circuits 120. FIG. 7A illustrates a diode configuration for use as one or more of the diode circuits 120 comprising three n-channel MOS transistors connected in series with the gates of the three transistors tied together and to an upper most transistor drain (at node 124). FIG. 7B illustrates an exemplary n-channel MOS transistor diode configuration for use as one or more of the diode circuits 120 comprising a single n-channel transistor with its gate tied to its drain (at node 124). FIG. 7C illustrates a diode configuration for use as one or more of the diode circuits 120 comprising two n-channel MOS transistors connected in series with the gates of the two transistors tied together and to an upper most transistor drain (at node 124). The included n-channel transistors in the circuits 120 are sized with W/L ratios selected to provide a certain voltage drop (offset) between the voltage reference and node 124 it being recognized by those skilled in the art that weaker the transistor the larger the voltage drop. A number of circuits 120 are provided, each with a different voltage drop (offset), in order to give a range of possible selections for the applied voltage offset and the low voltage $V_{L2}$. Thus, variations may be made from circuit 120 to circuit 120 of the width and length dimensions for the included n-channel MOS transistors. The correlation between voltage drop and the W/L ratio (size) of the n-channel transistors is well known to those skilled in the art. It will be noted that in the series connected transistor implementations the gates need not be tied together and to the upper most transistor drain, but may alternatively be individually tied to their own drains (as illustrated by the dotted lines in the figures).

While the implementations of FIGS. 6 and 7 are preferred, it will be understood by those skilled in the art that other types of voltage offset generating circuitry could alternatively be used.

Figures 8, 9:
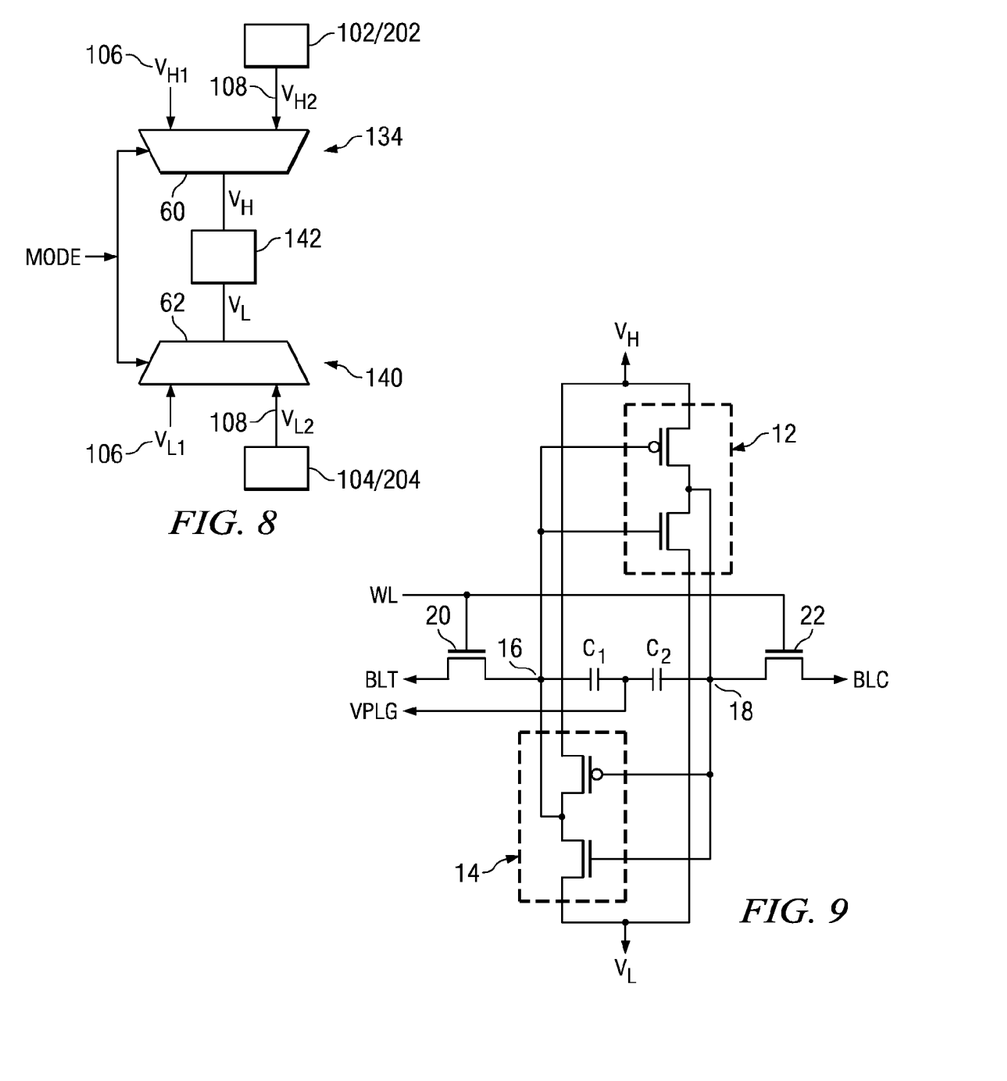
FIG. 8 is a block diagram showing static random access memory (SRAM) circuitry powered from switched power supply sets of voltages.
FIG. 9 is a schematic diagram of an alternative configuration six transistor static random access memory (SRAM) cell.

Reference is now made to FIG. 8 which is a block diagram showing SRAM circuitry 142 powered from switched power supply sets of voltages (each set including a high voltage and a low voltage). The power supply sets of voltages include the first power supply set of voltages 106 and the second power supply set of voltages 108. The second power supply set of voltages 108 is generated, as shown above, using the high and low side source bias circuits 102/104 and 202/204, respectively. Each power supply set of voltages 106 and 108 is associated with a different mode of operation for the SRAM circuitry 142. For example, the first power supply set of voltages 106 is associated with an active mode of all or part of the SRAM circuitry 142, such as when reading from or writing to SRAM cells therein. The second power supply set of voltages 108, on the other hand, is associated with a standby mode of all or part of the SRAM circuitry 142, such as when there is no reading from or writing to the included SRAM cells being performed. Although two power supply sets of voltages are shown and will be discussed herein, it will be understood that more than two power supply sets of voltages could be used, with each included power supply set of voltages being associated with a different operating mode of the SRAM circuitry 142. The additional set(s) of power supply voltages could be generated using circuitry like the high and low side source bias circuits 102/104 and 202/204 described above.

The SRAM circuitry 142 may comprise one or more SRAM cells having a standard six transistor static random access memory cell architecture as is shown in FIG. 1. The SRAM cells can alternatively have the architecture shown in FIG. 9 (described below). The cells can be organized in a matrix array format as is known for SRAM memories. Although described in the context of SRAM circuitry 142, the switched power supply sets of voltages could instead be advantageously used in connection with the mode switched powering of other types of integrated circuit memory cells (for example, content addressable memory) including transistors which have leakage concerns. Thus, the illustration of SRAM cells is by example only.

Reference is now made to FIG. 9 wherein there is shown a schematic diagram of an alternative configuration six transistor static random access memory (SRAM) cell which could be used for the SRAM circuitry 142. This cell has a schematic configuration like that shown in FIG. 1. Like reference numbers refer to like components and connections. This cell, however, adds a pair of capacitors C1 and C2 which are connected in series between the true node 16 and complement node 18. At the node where the capacitors C1 and C2 are connected in series, a global plate voltage VPLG is applied. The use of this capacitor configuration and VPLG voltage improves storage robustness of the memory cell. The VPLG voltage may, for example, be set at halfway between the supply voltages (for example, 0.6V-0.7V or about halfway between the high voltage $V_{H2}$ and low voltage $V_{L2}$) for an implementation where the active mode set of voltages applied to the high voltage $V_H$ node and low voltage $V_L$ node are about 1.2V-1.5V and 0V, respectively. Any suitable voltage generator circuit can be used to generate the VPLG voltage (for example, from the 1.2V-1.5V high voltage $V_H$). It will be recognized that circuitry having the configuration of one of the high and low side source bias circuits 102/104 and 202/204 described above could be used to generate a selectable and programmable VPLG voltage.

To retain data in a static random access memory (SRAM), power must be applied to the cell. If power is removed from the cell then the data stored therein is lost. It is likely that for a majority of the time that power is being applied to the memory cell, that power is being consumed in a standby or wait mode between instances of a read or write operation (active read/write mode). It is known in the art that integrated circuit transistors have non-ideal characteristics that draw power even when not active. These "leakage" currents can add up to be a serious problem in a circuit, such as a memory array, which includes a large number of transistors. Generally, the higher the high voltage in the voltage set (or higher the voltage difference within the set of voltages), the higher the potential leakage current which can occur. The circuitry described herein addresses this leakage current problem by reducing leakage current across a memory array in order to reduce the power consumed while an SRAM cell is in standby waiting to be written or read. This is especially of concern when the memory is powered from a battery power source, and when the array becomes very large in size.

Referring once again to FIG. 8, in a low power SRAM circuitry application, such as when the SRAM cells are used within a memory array in an integrated circuit device which is battery powered, the power supply sets of voltages are quite low. For example, the first power supply set of voltages 106 may include a high voltage $V_{H1}$ of 1.2V-1.5V and a low voltage $V_{L1}$ of 0V. The second power supply set of voltages 108, on the other hand, may include a high voltage $V_{H2}$ which is offset less than high voltage $V_{H1}$ and a low voltage $V_{L2}$ which is offset greater than low voltage $V_{L1}$. The voltage offsets, both high and low, used for the second power supply set of voltages 108 with respect to the first power supply set of voltages 108 are selected using the high and low side source bias circuits 102/104 and 202/204 in order to help address leakage current concerns associated with the operation of the circuit (more specifically, the cell) when in standby (no-read or no-write) mode. These voltage offsets as set by the selected diode circuits 110 and 120 may typically be in the range of 200-400 mV. In a particular, but not limiting, example, the second power supply set of voltages 108 may include a high voltage $V_{H2}$ of 0.9V-1.1V and a low voltage $V_{L2}$ of 0.3V-0.4V.

The first and second power supply sets of voltages 106 and 108 are selectively multiplexed for application to the high voltage $V_H$ node and low voltage $V_L$ node of the SRAM circuitry 142. This is accomplished by a first multiplexing circuit 60 (high control 134 of FIGS. 4 and 5) associated with the high voltage $V_H$ supply and a second multiplexing circuit 62 (low control 140 of FIGS. 4 and 5) associated with the low voltage $V_L$ supply. Operation of the first and second multiplexing circuits 60 and 62 is controlled responsive to a control signal MODE which is indicative of whether the SRAM circuitry 142 is in active mode (such as when reading from or writing to the cell) or is in standby mode (such as when there is no reading from or writing to the cell being performed). Active versus standby mode at the cell level may be determined by whether the word line WL is being asserted, whether a sense amplifier on the bit lines BLT/BLC is enabled, or some combination of the two, or through other means as known to those skilled in the art.

If the control signal MODE=active, then the first and second multiplexing circuits 60 and 62 operate responsive thereto to apply the first power supply set of voltages 106 (high voltage $V_{H1}$ and low voltage $V_{L1}$) as the high voltage $V_H$ supply and low voltage $V_L$ supply of the circuitry 142. Conversely, if the control signal MODE=standby, then the first and second multiplexing circuits 60 and 62 operate responsive thereto to apply the second power supply set of voltages 108 (high voltage $V_{H2}$ and low voltage $V_{L2}$) as the high voltage $V_H$ supply and low voltage $V_L$ supply of the circuitry 142. The reduction in the voltage potential difference between the high voltage $V_H$ supply and low voltage $V_L$ supply of the circuitry 142 when the high voltage $V_{H2}$ and low voltage $V_{L2}$ of the second set of voltages are instead applied serves to address concerns over transistor leakage because the cells leak, if at all, at a far reduced rate than if the high voltage $V_{H1}$ and low voltage $V_{L1}$ of the first set of voltages were being applied (such as is needed when in active mode).

In an alternative implementation, the multiplexers 60/62 could be eliminated and the circuitry 142 instead powered solely from high and low side source bias circuits 102/104 and 202/204 described above. Thus, the high voltage $V_{H2}$ and low voltage $V_{L2}$ outputs can be directly applied as the high voltage $V_H$ supply and low voltage $V_L$ supply of circuitry 142. Circuitry 142 would thus be powered from offset voltages while remaining portions of the integrated circuit could be powered from the high voltage $V_{H1}$ and low voltage $V_{L1}$ or some other set of voltages. The SRAM circuitry would still be fully operational (in all modes) at the high voltage $V_{H2}$ and low voltage $V_{L2}$, but operation may not be optimized in all modes at those voltages (for example, read and write mode may functional more slowly than if provided, for example, with the high voltage $V_{H1}$ and low voltage $V_{L1}$).

Figure 10:
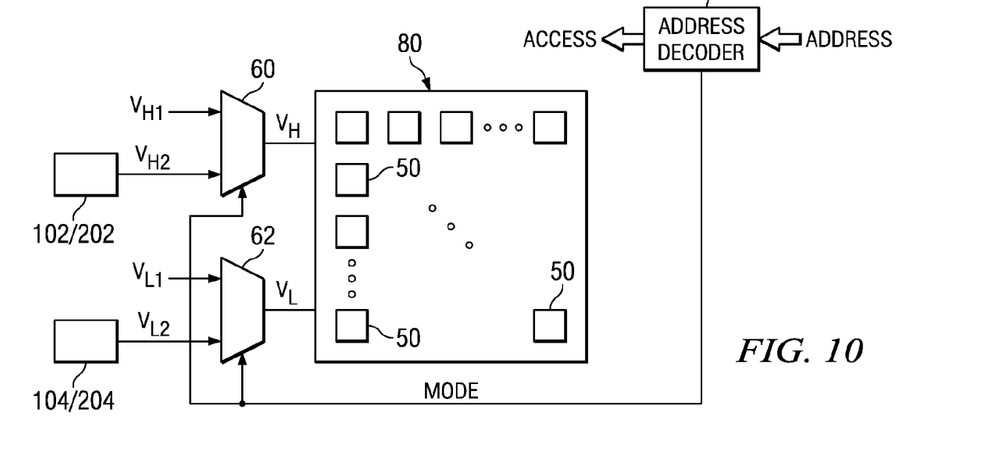
FIG. 10 illustrates a small size memory array powered from switched power supply sets of voltages.

With reference to FIG. 10, for a memory array 80 having a small size, the selective multiplexing of the first and second power supply sets of voltages 106 and 108 for application as the high voltage $V_H$ supply and low voltage $V_L$ supply can be implemented in a manner wherein the selective switching between the sets of voltages is applicable to each included memory cell 50 in the array 80. Thus, when the address decoder 90 functions to decode an address and access the array 80 (through word line and column selection as known in the art), the MODE signal is set to "active" and the multiplexers 60 and 62 function responsive thereto to apply the first power supply set of voltages 106 as the high voltage $V_H$ supply and low voltage $V_L$ supply. All included cells 50 in the array 80 will receive the first set of voltages 106 during the active mode. Conversely, when the address decoder is not functioning to decode an address for purposes of accessing the array 80 (in other words, there is no read/write access being performed at that time), the MODE signal is set to "standby" and the multiplexers 60 and 62 function responsive thereto to apply the second power supply set of voltages 108 as the high voltage $V_H$ supply and low voltage $V_L$ supply. As the memory array grows in size, however, this global switching between the first and second sets of voltages over the array of memory cells 50 is not a practical solution.

Figure 11:
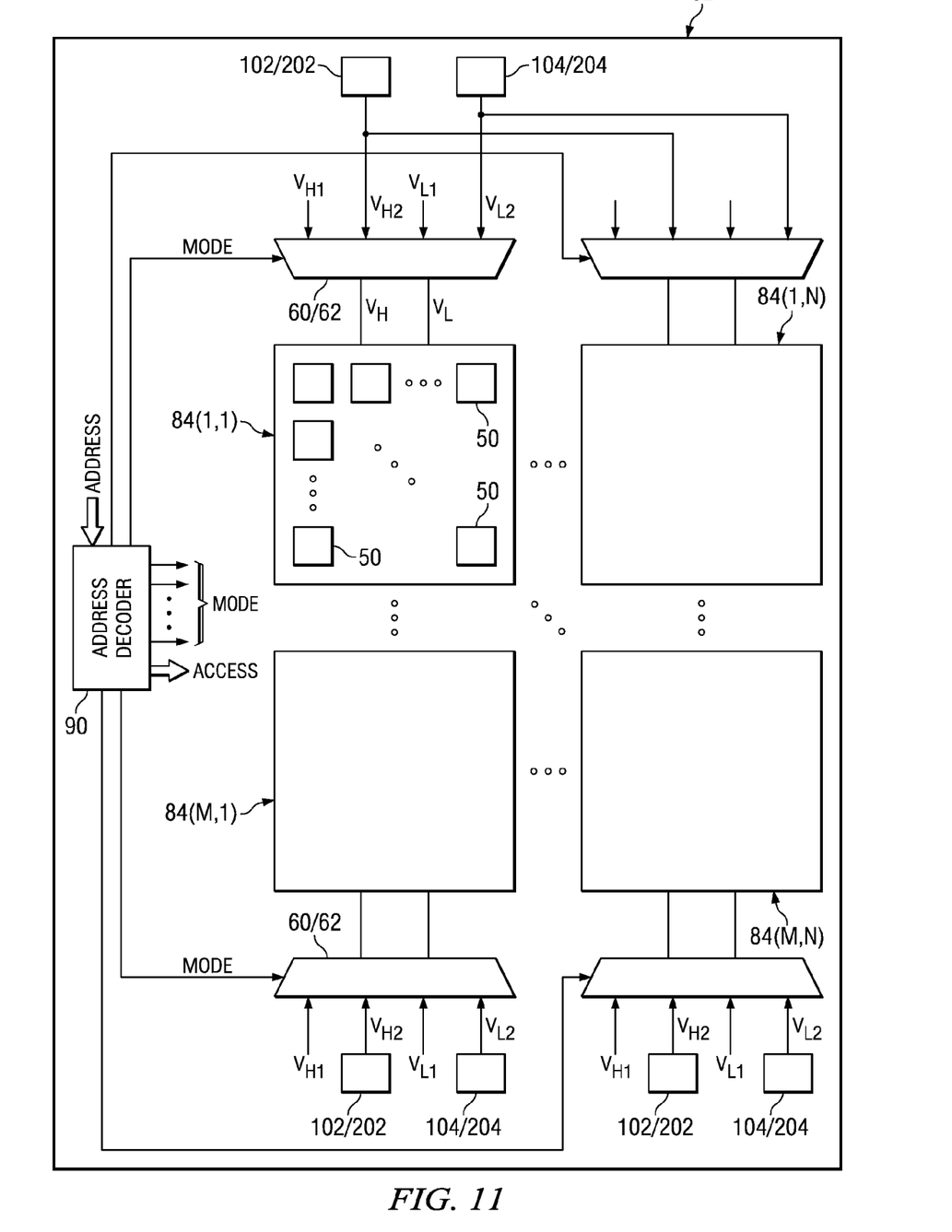
FIG. 11 illustrates a larger size memory array powered from switched power supply sets of voltages.

Referring now to FIG. 11 in a larger-sized memory array 82, the array can be divided up into a plurality of memory blocks 84 which are arranged in a matrix format (such as N×M). The number of blocks 84 included in the array 82 can widely vary depending on the circuit designer's needs. Each block 82 includes a plurality of SRAM cells 50 also arranged in a matrix format. The number of cells 50 included in the block 44 can widely vary depending on the circuit designer's needs. The selection of the number of blocks 84 and the number of cells 50 in each block, as well as the format of the matrix layout for blocks 84 and cells 50 therein, is made by the designer based on the use of the memory 82 in a given application.

An address decoder 90 decodes the address being applied to the memory array 82 and identifies the block 84 containing the cells 50 associated with that address. Responsive thereto, the decoder 90 accesses the array (for example, through word line and column selection as known in the art) and sets that MODE signal for that particular identified block to "active," with all other MODE signals (for the blocks containing non-addressed cells 50) being set to "standby." The multiplexing circuit(s) 60 and 62 which respond to a MODE=active signal then function to switch to the first power supply set of voltages 106 for application as the high voltage $V_H$ supply and low voltage $V_L$ supply of each included memory cell 50 in those one (or perhaps more) identified block(s) 84 containing addressed cells 50. Conversely, the multiplexing circuit(s) 60 and 62 which respond to a MODE=standby signal then function to switch to the second power supply set of voltages 108 for application as the high voltage $V_H$ supply and low voltage $V_L$ supply of each included memory cell 50 in those one (or perhaps more) block(s) 84 containing non-addressed cells 50.

In a specific example, assume the address being decoded applies to a row of cells 50 in block 84(1,1) of the N×M array 82. The multiplexing circuits 60 and 62 associated with block 84(1,1) respond to the MODE=active signal. All other blocks 84 in the array 82, however, respond to the MODE=standby signal. Block 84(1,1), through its multiplexing circuits 60 and 62, receives the first power supply set of voltages 106 as the high voltage $V_H$ supply and low voltage $V_L$ supply. Power distribution circuitry within block 84(1,1), as known to those skilled in the art, applies the first power supply set of voltages 106 received from the multiplexers to each cell 50 in that block (for example, by application to the source terminals of the CMOS inverter transistors in the SRAM cell 10 shown in FIG. 1).

Further to the foregoing example, the other blocks 84 do not include addressed cells 50. Their respective multiplexing circuits 60 and 62 each respond to the MODE=standby signal, and apply the second power supply set of voltages 108 as the high voltage $V_H$ supply and low voltage $V_L$ supply. Power distribution circuitry within each block 84, as known to those skilled in the art, applies the second power supply set of voltages 108 received from the multiplexers to each cell 50 in those blocks (for example, by application to the source terminals of the CMOS inverter transistors in the SRAM cell 10 shown in FIG. 1).

With the application of the second power supply set of voltages 108 to all non-addressed blocks 84 in the array, there will be a reduction in leakage current in the cells 50 of those blocks 84, and thus there will also be a reduction in standby mode power loss.

The hierarchical architecture shown in FIG. 11 with multiple blocks 84 within array 82 is by way of example only. Additional layers in the hierarchy can be used. For example, each block 84 can be divided into multiple sections arranged in a matrix format. The number of sections included in each block 84 can widely vary depending on the circuit designer's needs. Each section would include a plurality of SRAM cells 50 also arranged in a matrix format. The number of cells 50 included in each section can widely vary depending on the circuit designer's needs. With this architecture, the multiplexing circuits 60 and 62 would instead be associated at the section level, and the decoder 90 would generate appropriate MODE signals whose value (active or standby) would depend on which section included the addressed cells 50 which are being accessed. As a practical example, a section could comprise 64 rows×64 columns of cells 50 (i.e., 64×64 cells). A block 84 could comprise 1×32 sections. The array 82 could comprise 32×2 blocks 84 (thus providing a total 8 Mbit array).

The circuitry described above accordingly allows two power supply sets of voltages to be selectively multiplexed onto the memory cell power grid of a memory array. This approach places both sets of voltages throughout the array for selective use, and switches the power supply received between those sets of voltages on a much smaller scale of, for example, a section of 64 rows by 64 columns or a block 84 of multiple sections. The multiplexers for each section/block include transistors that effectively multiplex the high and low power connection between a first set of voltages providing full voltage values at a high voltage (1.5V) and a low voltage (0V) and a second set of voltages which are offset providing a high voltage (1.1V) and a low voltage (0.4V). High and low side source bias circuits 102/104 and 202/204 supply at least the second set of voltage (the offset voltages). Tweaking of the voltage offset amounts can be accomplished through trimming, programming and selection circuitry as discussed above in connection with FIGS. 4 and 5.

While in normal operation and when the array is waiting for access (read/write) the offset voltages from the second set of voltages are connected to all sections/blocks to effectuate a reduction in leakage current. When a section is awakened for writing or reading, the offset voltages are disconnected from the section/block that has been addressed and the full voltages of the first set of voltages are applied thereto. The size of the section/block is chosen based on two design considerations. The capacitance of the section/block power grid must be small enough such that switching can be done in a reasonable amount of time. Secondly, the overhead area for the switches used for multiplexing should not be too large relative to the memory cell array area.

FIG. 11 illustrates two ways to power the array of memory cells. At the top of the figure, the high and low side source bias circuits 102/104 and 202/204 generate voltages which are shared by a plurality of multiplexer circuits 60/62. At the bottom of the figure, high and low side source bias circuits 102/104 and 202/204 are associated with each multiplexer circuit 60/62.

Figure 12:
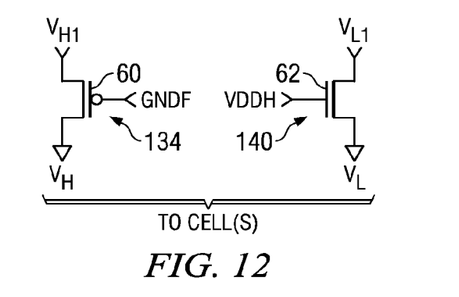
FIG. 12 is a schematic diagram of transistors within a multiplexing circuit which selectively connects voltages from a first power supply set of voltages to SRAM circuitry.

Reference is now made to FIG. 12 which shows a schematic diagram of the transistors within the multiplexers 60 and 62 which connect the full voltages of the first power supply set of voltages comprising high voltage $V_{H1}$ and low voltage $V_{L1}$ for application as the high voltage $V_H$ supply and low voltage $V_L$ supply of a section, block or array containing memory cells. In the section implementation, for example, there is one set of each of these FIG. 12 transistors on each column for each section of the full array. The size and the number of these transistors are selected for area limitations and to provide the proper recovery time when an access is to take place. The p-channel transistor gates and n-channel transistor gates are controlled by complimentary signals GNDF and VDDH, respectively, which are derived from the MODE signal (in a manner to be discussed). These GNDF and VDDH signals are in a first complementary mode when the address decoder 90 points to the array section to be accessed (i.e., when MODE=active).

Figure 13:
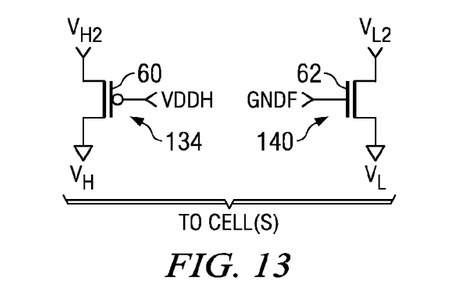
FIG. 13 is a schematic diagram of transistors within a multiplexing circuit which selectively connects voltages from a second power supply set of voltages to SRAM circuitry.

Reference is now made to FIG. 13 which shows a schematic diagram of the transistors within the multiplexers 60 and 62 which connect the offset voltages of the second power supply set of voltages comprising high voltage $V_{H2}$ and low voltage $V_{L2}$ for application as the high voltage $V_H$ supply and low voltage $V_L$ supply of a section, block or array of memory cells. The transistors here are placed on the row pitch rather than on the column pitch. The p-channel transistor gates and n-channel transistor gates are controlled by complimentary signals VDDH and GNDF, respectively, which are derived from the MODE signal. These VDDH and GNDF signals are a second complementary mode when the address decoder 90 is not pointing to the array section (i.e., when MODE=standby).

It will be noted that the gate control signals in FIGS. 12 and 13 are swapped with respect to each other. The result is that the high voltage $V_H$ supply and low voltage $V_L$ supply of a section, block or array can be connected to receive only one of the first and second power supply sets of voltages at any one time.

Figure 14:
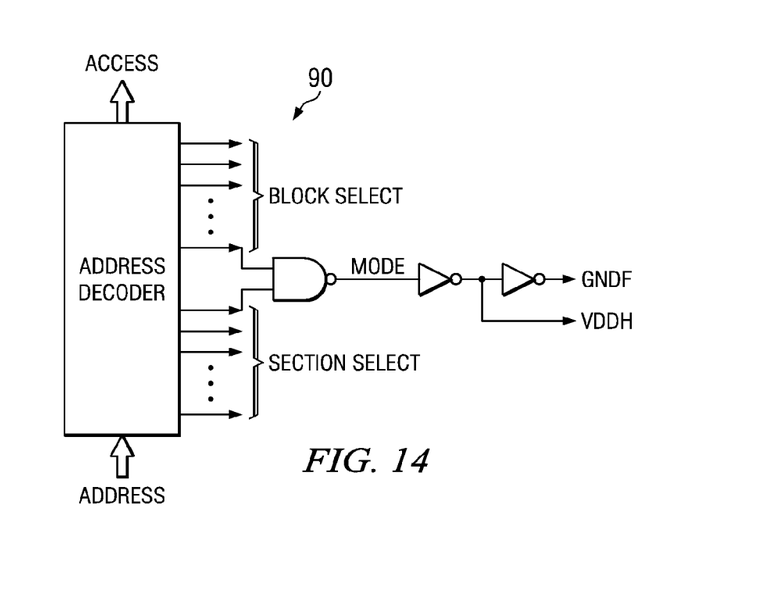
FIG. 14 is a block diagram of exemplary circuitry for controlling the multiplexing circuitry of FIGS. 12 and 13.

With reference to FIG. 14, there is shown a block diagram of circuitry for controlling the multiplexing circuitry of FIGS. 12 and 13. This particular illustration is applicable to the situation where the array 82 includes multiple blocks 84 and each block includes multiple sections, and each section includes multiple cells 50. Switched power supply sets of voltages are applied in this instance at the section level of the architectural hierarchy. The address decoder responds to a received address for accessing cell(s) 50 of the array by generating appropriate array access signals (for example, through word line and column selection as known in the art). The decoder further includes a plurality of block select outputs associated with the plurality of blocks 84 in the array 82, and a plurality of section select outputs associated with the plurality of sections. Logic circuitry, for example comprising a NAND gate, logically combines one block select output (for the block 84 within which the addressed cell(s) are located) and one section select output (for the section within which the addressed cell(s) are located) to generate the MODE signal at the section level of the hierarchy. This MODE signal is in an "active" state when the addressed cell(s) are in the associated block 84 and one particular section within that block. Otherwise, MODE=standby. A set of inverters buffer the MODE signal and generate complementary multiplexer control signals GNDF and VDDH which are applied to the circuitry of FIGS. 12 and 13 in order to make a selection, at the section level, between application of the first set of voltages 106 as the high voltage $V_H$ supply and low voltage $V_L$ supply (when MODE=active) or application of the second set of voltages 108 as the high voltage $V_H$ supply and low voltage $V_L$ supply (when MODE=standby). The illustrated logic circuitry is exemplary in nature only, it being understood that one skilled in the art can design a number of possible circuits for responding to received address for memory array access and generate, at a section level of the hierarchy, an appropriate MODE signal representative of whether the address is pertinent to a given section (active) or not (standby).

In the event the architectural hierarchy of the array 82 goes down only to the block 84 level, it will be recognized that the plurality of block select outputs would comprise individual MODE signals. A two inverter buffer circuit as shown in FIG. 14 could then be used to buffer the MODE signal and generate complementary multiplexer control signals GNDF and VDDH which are applied to the circuitry of FIGS. 12 and 13 in order to make a selection, at the block 84 level of the hierarchy, between application of the first set of voltages 106 as the high voltage $V_H$ supply and low voltage $V_L$ supply (when MODE=active) or application of the second set of voltages 108 as the high voltage $V_H$ supply and low voltage $V_L$ supply (when MODE=standby).

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
  a memory circuit receiving a high supply voltage and a low supply voltage; and
  a programmable bias circuit which generates, from a first set of voltages, a second set of voltages for application as the high supply voltage and a low supply voltage, comprising:
    a high side circuit including a first plurality of individually selectable voltage offset circuits each of which providing a different offset voltage between a high voltage of the first set of voltages and a high voltage of the second set of voltages, wherein the high voltage of the second set of voltages is less than the high voltage of the first set of voltages; and
    a low side circuit including a second plurality of individually selectable voltage offset circuits each of which providing a different offset voltage between a low voltage of the first set of voltages and a low voltage of the second set of voltages, wherein the low voltage of the second set of voltages is greater than the low voltage of the first set of voltages.

2. The circuit of claim 1 wherein the circuit is an integrated circuit.

3. The circuit of claim 1 further comprising: a voltage selection circuit responsive to at least one control signal which selectively applies one of either the first set of voltages or the second set of voltages as the high supply voltage and low supply voltage of the memory circuit.

4. The circuit of claim 3 wherein the voltage selection circuit comprises a multiplexing circuit that operates to select between the first set of voltages and the second set of voltages based on the at least one control signal.

5. The circuit of claim 1 wherein the first and second plurality of individually selectable voltage offset circuits each comprise diode circuits.

6. The circuit of claim 5 wherein the first plurality of individually selectable voltage offset circuits comprise a plurality of p-channel based diode circuits each having a different voltage offset.

7. The circuit of claim 5 wherein the second plurality of individually selectable voltage offset circuits comprise a plurality of n-channel based diode circuits each having a different voltage offset.

8. The circuit of claim 1 wherein each circuit in the first and second plurality of individually selectable voltage offset circuits comprises:
a diode-based offset circuit; and
a selection circuit which selects whether the diode-based offset circuit is actuated.

9. The circuit of claim 8 wherein the selection circuit comprises a selectively blowable fuse element.

10. The circuit of claim 8 wherein the selection circuit comprises a selectively actuated switch circuit.

11. The circuit of claim 10 wherein the selectively actuated switch circuit is responsive to a control signal.

12. The circuit of claim 11, further comprising a decoder circuit and a register to receive data specifying which diode offset circuits are to be actuated, the decoder circuit receiving signals output from the register and decoding those signals to generate the control signal.

13. The circuit of claim 1 further comprising:
a voltage selection circuit responsive to at least one mode signal indicative of whether the memory circuit is in one of an active read/write mode or a standby no read/no write mode;
wherein the voltage selection circuit selectively applies the first set of voltages as the high supply voltage and low supply voltage of the memory circuit if the memory circuit is in active read/write mode; and
wherein the voltage selection circuit selectively applies the second set of voltages as the high supply voltage and low supply voltage of the memory circuit if the memory circuit is in standby no read/no write mode.

14. A circuit, comprising:
a memory circuit having a high voltage supply node and a low voltage supply node;
first circuitry receiving a first high supply voltage and a second high supply voltage and operating responsive to a first control signal to apply the first high supply voltage to the high voltage supply node if the first control signal has a first state, and apply the second high supply voltage to the high voltage supply node if the first control signal has a second state;
a high side supply circuit that generates the second high supply voltage which is less than the first high supply voltage by a selectable at least one of a plurality of high side voltage offsets;
second circuitry receiving a first low supply voltage and a second low supply voltage and operating responsive to a second control signal to apply the first low supply voltage to the low voltage supply node if the second control signal has a first state, and apply the second low supply voltage to the low voltage supply node if the second control signal has a second state; and
a low side supply circuit that generates the second low supply voltage which is greater than the first low supply voltage by a selectable at least one of a plurality of low side voltage offsets.

15. The circuit of claim 14 wherein the circuit is an integrated circuit.

16. The circuit of claim 14:
wherein the high side supply circuit includes first means for selecting a certain at least one of the plurality of high side voltage offsets; and
wherein the low side supply circuit includes second means for selecting a certain at least one of the plurality of low side voltage offsets.

17. The circuit of claim 16 wherein the first and second means for selecting comprise a plurality of selectively blowable fuse elements.

18. The circuit of claim 16 wherein the first and second means for selecting comprise a plurality of selectively actuated switch circuits.

19. The circuit of claim 18 wherein each selectively actuated switch circuit is responsive to a control signal.

20. The circuit of claim 19, further comprising a decoder circuit and a register to receive data specifying which voltage offset is selected, the decoder circuit receiving signals output from the register and decoding those signals to generate the control signal causing one of the selectively actuated switch circuits to select that voltage offset.

21. The circuit of claim 14 wherein the high and low side supply circuits each include a plurality of individually selectable voltage offset circuits, and wherein each individually selectable voltage offset circuit comprises:
a diode-based offset circuit; and
a selection circuit which selects whether the diode-based offset circuit is actuated.

22. A circuit, comprising:
a memory circuit having a high voltage supply node and a low voltage supply node;
circuitry to selectively apply one of a first set of voltages and a second set of voltages to the high and low voltage supply nodes of the memory circuit in dependence upon an operational mode of the memory circuit, wherein the circuitry selectively applies the first set of voltages if the memory circuit is in active read or write mode and selectively applies the second set of voltages if the memory circuit is in standby no-read or no-write mode; and
a voltage generating circuit that generates the second set of voltages to have a low voltage higher than a low voltage in the first set of voltages by a selected at least one of a plurality of low offset voltages, and have a high voltage less than a high voltage in the first set of voltages by a selected at least one of a plurality of high offset voltages.

23. The circuit of claim 22 wherein the circuit is an integrated circuit.

24. The circuit of claim 22 wherein the voltage generating circuit comprises
a low side circuit including a first plurality of individually selectable voltage offset circuits each of which providing a different low offset voltage; and
a high side circuit including a second plurality of individually selectable voltage offset circuits each of which providing a different high offset voltage.

25. The circuit of claim 24 wherein each circuit in the first and second plurality of individually selectable voltage offset circuits comprises:
a diode-based offset circuit; and
a selection circuit which selects whether the diode-based offset circuit is active to supply the offset voltage.

* * * * *